US012574055B2

(12) United States Patent
Mori et al.

(10) Patent No.: US 12,574,055 B2
(45) Date of Patent: Mar. 10, 2026

(54) RADIO-FREQUENCY CIRCUIT

(71) Applicant: Murata Manufacturing Co., Ltd.,
Nagaokakyo (JP)

(72) Inventors: Hirotsugu Mori, Nagaokakyo (JP);
Hidenori Obiya, Nagaokakyo (JP);
Morio Takeuchi, Nagaokakyo (JP)

(73) Assignee: **MURATA MANUFACTURING CO.,
LTD.**, Nagaokakyo (JP)

( * ) Notice: Subject to any disclaimer, the term of this
patent is extended or adjusted under 35
U.S.C. 154(b) by 330 days.

(21) Appl. No.: 18/191,008

(22) Filed: Mar. 28, 2023

(65) Prior Publication Data

US 2023/0238985 A1     Jul. 27, 2023

Related U.S. Application Data

(63) Continuation of application No.
PCT/JP2021/030461, filed on Aug. 19, 2021.

(30) Foreign Application Priority Data

Oct. 8, 2020     (JP) ................................. 2020-170425

(51) Int. Cl.
H04B 1/00     (2006.01)
H03F 1/02     (2006.01)
H03F 3/21     (2006.01)
H04B 1/04     (2006.01)
(52) U.S. Cl.
CPC ........... H04B 1/006 (2013.01); H03F 1/0277
(2013.01); H03F 3/211 (2013.01); *H03F
2200/451* (2013.01); *H04B 2001/0408*
(2013.01)
(58) Field of Classification Search
CPC ........ H04B 1/006; H04B 1/0057; H04B 1/00;
H04B 1/38; H03F 1/0277; H03F 3/211
See application file for complete search history.

(56) References Cited

U.S. PATENT DOCUMENTS

2002/0177465 A1     11/2002  Robinett
2015/0133067 A1      5/2015  Chang et al.
2019/0181907 A1*     6/2019  Pfann ........................ H03H 9/48
2019/0356344 A1*    11/2019  Takada ................. H04B 1/0064

FOREIGN PATENT DOCUMENTS

JP        10-190507 A      7/1998
JP        2002-354073 A    12/2002
JP        2010-278886 A    12/2010
JP        2017-011402 A     1/2017

OTHER PUBLICATIONS

International Search Report and Written Opinion mailed on Oct. 5,
2021, received for PCT Application PCT/JP2021/030461, filed on
Aug. 19, 2021, 9 pages including English Translation.
Ligado Networks, "Regulatory updates for 3GPP Band 24", 3GPP
TSG-RAN4 Meeting #95-e, R4-2006090, May 25-Jun. 5, 2020, pp.
1-6.

* cited by examiner

*Primary Examiner* — Ayodeji O Ayotunde
(74) *Attorney, Agent, or Firm* — XSENSUS LLP

(57)     ABSTRACT

A radio-frequency circuit includes a filter circuit and a
power amplifier circuit. The filter circuit includes a first pass
band corresponding to a band of a cellular communication
system and a second pass band corresponding to a band of
a satellite communication system. The power amplifier is
connected to the filter circuit. The second pass band is
positioned between the first pass band and a third pass band
corresponding to a band of a satellite navigation system, or
the second pass band at least partially matches the first pass
band.

20 Claims, 11 Drawing Sheets

FIG. 2

| BAND C<br>(SATELLITE NAVIGATION<br>SYSTEM) | BAND C1 | GPS (L1) $\frac{1563 \quad 1587}{\rule{2cm}{0.4mm}}$ |
| | BAND C2 | GLONASS (L1) $\frac{1593 \quad 1610}{\rule{0.5cm}{0.4mm}}$ |
| BAND B<br>(SATELLITE<br>COMMUNICATION<br>SYSTEM) | BAND B1 | Globalstar $\frac{1610 \qquad 1621.35}{\rule{2.5cm}{0.4mm}}$ |
| | BAND B2 | Iridium $\frac{1621.35 \quad 1626.5}{\rule{1cm}{0.4mm}}$ |
| BAND A<br>(CELLULAR<br>COMMUNICATION<br>SYSTEM) | BAND A1 | B24Rx $\frac{1525 \qquad 1559}{\rule{2cm}{0.4mm}}$ |
| | BAND A2 | B24Tx $\frac{1626.5 \qquad 1660.5}{\rule{1cm}{0.4mm} \quad \rule{1cm}{0.4mm}}$ |

FREQUENCY (MHz)

RADIO-FREQUENCY CIRCUIT

CROSS-REFERENCE TO RELATED APPLICATIONS

The present application is a bypass continuation of PCT filing PCT/JP2021/030461, filed on Aug. 19, 2021, which claims priority to Japanese Patent Application No. 2020-170425, filed on Oct. 8, 2020, the entire contents of both of which are hereby incorporated by reference.

BACKGROUND

1. Field

The present disclosure relates to a radio-frequency circuit.

2. Description of the Related Art

In mobile communication equipment, such as a cellular phone, the number of circuit components, in particular, of a radio-frequency front-end module is increasing in response to a demand for supporting multiple bands. To address this issue, for example, U.S. Patent Application Publication No. 2015/0133067 discloses a front-end module including a power amplifier, switches, and filters as a package.

SUMMARY

There may also be a demand for mobile communication equipment that supports multiple satellite systems in addition to a cellular communication system. However, individually installing plural modules in mobile communication equipment to support different satellite systems increases the size of the mobile communication equipment.

It is an object of the present disclosure to provide a radio-frequency circuit that can support both a cellular communication system and a satellite system without increasing the size of a communication apparatus.

A radio-frequency circuit according to an exemplary aspect of the disclosure includes a first filter and an amplifier. The pass band of the first filter includes a first band for a cellular communication system and a second band for a first satellite system. The amplifier is connected to the first filter. The second band is positioned between the first band and a third band for a second satellite system, or the second band at least partially matches the first band.

According to an exemplary aspect of the disclosure, it is possible to provide a radio-frequency circuit that can support both a cellular communication system and a satellite system without increasing a size of a communication apparatus.

BRIEF DESCRIPTION OF THE DRAWINGS

FIG. 2 illustrates specific examples of bands;

DESCRIPTION OF THE PREFERRED EMBODIMENTS

Figure 1:
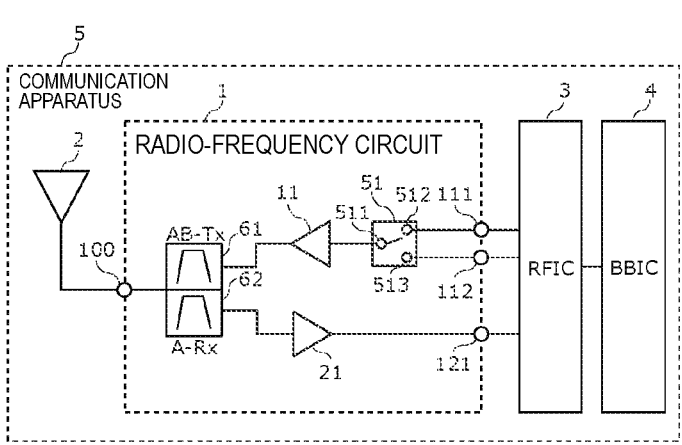
FIG. 1 is a circuit diagram of a radio-frequency circuit and a communication apparatus according to a first exemplary embodiment.

Exemplary embodiments of the disclosure will be described below in detail with reference to the accompanying drawings. The exemplary embodiments described below illustrate general or specific examples. Numerical values, configurations, materials, components, and positions and connection states of the components illustrated in the following embodiments are only examples and are not intended for limiting the invention.

The drawings are only schematically shown and are not necessarily drawn to scale. For the sake of representation, the drawings are illustrated in an exaggerated manner or with omissions and the ratios of components in the drawings are adjusted. The configurations, positional relationships, and ratios of components in the drawings may be different from those of the actual components. In the drawings, substantially identical components are designated by like reference numeral, and an explanation of such components will not be repeated or be merely simplified.

In the disclosure, "A is connected to B" includes, not only the meaning that A is directly connected to B using a connecting terminal and/or a wiring conductor, but also the meaning that A is electrically connected to B via another circuit element. "Being connected between A and B" means that "being connected to both A and B between A and B".

First Exemplary Embodiment

[1.1 Circuit Configurations of Radio-Frequency Circuit 1 and Communication Apparatus 5]

The circuit configurations of a radio-frequency circuit 1 and a communication apparatus 5 according to a first exemplary embodiment will be described below with reference to FIG. 1. FIG. 1 is a circuit diagram of the radio-frequency circuit 1 and the communication apparatus 5 according to the first exemplary embodiment.

[1.1.1 Circuit Configuration of Communication Apparatus 5]

The circuit configuration of the communication apparatus 5 will first be discussed. As illustrated in FIG. 1, the communication apparatus 5 according to the first exemplary embodiment includes a radio-frequency circuit 1, an antenna 2, a radio-frequency integrated circuit (RFIC) 3, and a baseband integrated circuit (BBIC) 4.

The radio-frequency circuit 1 transmits a radio-frequency signal between the antenna 2 and the RFIC 3. The detailed circuit configuration of the radio-frequency circuit 1 will be discussed later.

The antenna 2 is connected to an antenna connecting terminal 100 of the radio-frequency circuit 1. The antenna 2 sends a radio-frequency signal output from the radio-frequency circuit 1 and receives a radio-frequency signal from an external source and outputs it to the radio-frequency circuit 1.

The RFIC 3 is an example of a signal processing circuit that processes a radio-frequency signal. The RFIC 3 will be explained below more specifically. The RFIC 3 performs signal processing, such as down-conversion, on a radio-frequency received signal, which is received via a receive path of the radio-frequency circuit 1, and outputs the resulting received signal to the BBIC 4. The RFIC 3 also performs signal processing, such as up-conversion, on a sending signal received from the BBIC 4 and outputs the resulting radio-frequency sending signal to a sending path of the radio-frequency circuit 1. The RFIC 3 includes a controller that controls components, such as switches and amplifiers, of the radio-frequency circuit 1. All or some of the functions of the RFIC 3 as the controller may be implemented in a source outside the RFIC 3, such as in the BBIC 4 or the radio-frequency circuit 1.

The BBIC 4 is a baseband signal processing circuit that performs signal processing by using an intermediate-frequency band, which is lower than a radio-frequency signal transmitted by the radio-frequency circuit 1. Examples of signals to be processed by the BBIC 4 are image signals for displaying images and/or audio signals for performing communication via a speaker.

The antenna 2 and the BBIC 4 are not essential components for the communication apparatus 5 of the first embodiment.

[1.1.2 Circuit Configuration of Radio-Frequency Circuit 1]

The circuit configuration of the radio-frequency circuit 1 will now be explained below. As illustrated in FIG. 1, the radio-frequency circuit 1 includes a power amplifier 11, a low-noise amplifier 21, a switch 51, filters 61 and 62, an antenna connecting terminal 100, radio-frequency input terminals 111 and 112, and a radio-frequency output terminal 121.

The antenna connecting terminal 100 is an external connection terminal of the radio-frequency circuit 1 and is connected to the antenna 2.

The radio-frequency input terminal 111 is an example of a first radio-frequency input terminal. The radio-frequency input terminal 111 is an external connection terminal of the radio-frequency circuit 1 for receiving a sending signal of band A2. The radio-frequency input terminal 111 is connected to the RFIC 3.

The radio-frequency input terminal 112 is an example of a second radio-frequency input terminal. The radio-frequency input terminal 112 is an external connection terminal of the radio-frequency circuit 1 for receiving a sending signal of band B f. The radio-frequency input terminal 112 is connected to the RFIC 3.

The radio-frequency output terminal 121 is an external terminal for outputting a received signal of band A1. The radio-frequency output terminal 121 is connected to the RFIC 3 a.

Details of bands will be explained later with reference to FIG. 2.

The power amplifier 11 can amplify a radio-frequency sending signal received from the RFIC 3. The power amplifier 11 is connected to the radio-frequency input terminals 111 and 112 via the switch 51 so that it can amplify sending signals of band A2 and band B respectively received from the RFIC 3 via the radio-frequency input terminals 111 and

112. The internal configuration of the power amplifier 11 is not limited to a specific configuration. For example, the power amplifier 11 may be a multistage amplifier or a differential amplifier that converts a signal into a difference signal and amplifies it. Other power amplifier configurations and circuit topologies are also possible without departing from the scope of the present disclosure.

The power amplifier 11 has first and second amplification modes. When a sending signal of band A2 is to be amplified, the first amplification mode is applied to the power amplifier 11. That is, when the radio-frequency input terminal 111 is connected to the input terminal of the power amplifier 11 by the switch 51, the first amplification mode is applied to the power amplifier 11. When a sending signal of band B is to be amplified, the second amplification mode is applied to the power amplifier 11. That is, when the radio-frequency input terminal 112 is connected to the input terminal of the power amplifier 11 by the switch 51, the second amplification mode is applied to the power amplifier 11.

At least one of a power supply voltage and a bias signal to be supplied to the power amplifier 11 is adjusted. As the system for making this adjustment, different systems are used for the first amplification mode and the second amplification mode. For example, envelope tracking (ET) can be used for one of the first and second amplification modes, while average power tracking (APT) can be used for the other one of the first and second amplification modes.

Typically, in the amplification mode using the ET system (hereinafter called the ET mode), the power supply voltage is applied to a power amplifier in accordance with the level of an input signal so that the power amplifier can operate in a compression region. This can lower power consumption of the power amplifier but can increase distortion of a signal, compared with the amplification mode using the APT system (hereinafter called the APT mode). In contrast, the APT mode is less likely to lower power consumption but is more likely to reduce distortion of a signal than the ET mode.

The low-noise amplifier 21 is an example of a first low-noise amplifier. The low-noise amplifier 21 can amplify a radio-frequency received signal received via the antenna connecting terminal 100. In this example, the low-noise amplifier 21 can amplify a received signal of band A1 received from the antenna connecting terminal 100 via the filter 62. A radio-frequency signal amplified by the low-noise amplifier 21 is output to the radio-frequency output terminal 121. The internal configuration of the low-noise amplifier 21 is not limited to a particular configuration, and can be any structure, configuration, or circuit topology without departing from the scope of the present disclosure.

The switch 51 is an example of a fourth switch. The switch 51 is connected between the radio-frequency input terminals 111 and 112 and the power amplifier 11. An exemplary configuration of the switch 51 is as follows. The switch 51 has terminals 511, 512, and 513. The terminal 511 is connected to the input terminal of the power amplifier 11. The terminal 512 is connected to the radio-frequency input terminal 111, while the terminal 513 is connected to the radio-frequency input terminal 112.

With this connection configuration, the switch 51 can connect one of the terminals 512 and 513 to the terminal 511, based on a control signal from the RFIC 3, for example. That is, the switch 51 can selectively connect the power amplifier 11 to the radio-frequency input terminal 111 or to the radio-frequency input terminal 112. The switch 51 may be a single pole double throw (SPDT) switch circuit. However, one of ordinary skill will recognize that other switch configurations are possible without departing from the scope of the present disclosure.

The filter 61 (AB-Tx) is an example of a first filter and is connected between the power amplifier 11 and the antenna connecting terminal 100. Among the radio-frequency signals amplified by the power amplifier 11, the filter 61 allows sending signals of band A2 and band B to pass therethrough. That is, the filter 61 has a pass band including band A2 and band B.

The filter 62 (A-Rx) is connected between the low-noise amplifier 21 and the antenna connecting terminal 100. Among the radio-frequency signals input from the antenna connecting terminal 100, the filter 62 allows received signals of band A1 to pass therethrough. That is, the filter 62 has a pass band including band A1.

Each of the filters 61 and 62 may be any one of a surface acoustic wave (SAW) filter, a bulk acoustic wave (BAW) filter, an LC resonance filter, and a dielectric filter. The filters 61 and 62 may also be filters other than these types of filters, as one of ordinary skill would recognize.

The provision of some of the circuit elements shown in FIG. 1 in the radio-frequency circuit 1 may be omitted. For example, it is sufficient that the radio-frequency circuit 1 includes at least the power amplifier 11 and the filter 61. Other circuit elements, such as the low-noise amplifier 21, the switch 51, and the filter 62, may also be omitted without departing from the scope of the present disclosure.

[1.2 Examples of Bands]

Bands used in the radio-frequency circuit 1 will now be explained below. A band refers to a frequency band for a wireless system to be constructed using a radio access technology (RAT). A band can be predefined by a standards organization (such as 3rd Generation Partnership Project (3GPP) and Institute of Electrical and Electronics Engineers (IEEE)).

As a wireless system, a cellular communication system and a satellite system, for example, are used. The cellular communication system includes a non-terrestrial network (NTN) as well as a terrestrial network (TN). The NTN is a network standardized by 3GPP to integrate a satellite system, for example, to the cellular communication system. The wireless system is not restricted to these types of systems. For example, a wireless local area network (WLAN) system may be used. Thus, the specific wireless system(s) described in this disclosure are merely exemplary rather than limiting.

In the first exemplary embodiment, as the cellular communication system, a Long Term Evolution (LTE) communication system and/or a 5th Generation New Radio (5GNR) communication system, are used. However, the cellular communication system is not limited to these types of systems, and other cellular communication systems are possible without departing from the scope of the present disclosure.

The satellite system includes a satellite navigation system and a satellite communication system. The satellite communication system includes the NTN, but does not include the TN. In the first exemplary embodiment, the satellite navigation system is an example of a first satellite system, while the satellite communication system is an example of a second satellite system.

As the satellite navigation system, a Global Positioning System (GPS) and a Global Navigation Satellite System (GLONASS), for example, can be used. As the satellite communication system, a Globalstar satellite system and an Iridium satellite system, for example, can be used. The satellite navigation system and the satellite communication system are not limited to the above-described types of systems, and other satellite systems are possible as one of ordinary skill would recognize.

Examples of the bands used in the first exemplary embodiment will now be described below with reference to FIG. 2. FIG. 2 illustrates examples of bands.

Band A is a frequency division duplex (FDD) band for a communication system. Band A includes band A1 and band A2 which do not overlap each other. In the first embodiment, band A1 is an example of a fourth band, while band A2 is an example of a first band.

Band A1 and band A2 may be time division duplex (TDD) bands. That is, band A1 and band A2 may be TDD bands different from each other.

In the example in FIG. 2, band A is LTE Band 24 or 5GNR n24. Band A1 is a downlink operating band (1525 to 1559 MHZ) of band A. Band A2 is an uplink operating band (1626.5 to 1660.5 MHZ) of band A.

Band B is a frequency band for the satellite communication system. Band B includes band B1 and band B2 which do not overlap each other. Band B is positioned between band C and band A2 and between band A1 and band A2. In the first exemplary embodiment, band B1 and/or band B2 are an example of a second band.

In the example in FIG. 2, band B1 is a frequency band (1610 to 1621.35 MHz) for the Globalstar satellite system, while band B2 is a frequency band (1621.35 to 1626.5 MHz) for the Iridium satellite system.

Band C is a frequency band for the satellite navigation system. Band C includes band C1 and band C2 which do not overlap each other and is positioned between band A1 and band A2. In the first embodiment, band C1 is an example of a third band.

In the example in FIG. 2, band C1 is a frequency band (1563 to 1587 MHz) for a GPS L1 signal, while band C2 is a frequency band (1593 to 1610 MHz) for a GLONASS L1 signal.

The bands shown in FIG. 2 are only examples. Bands that can be used in the first exemplary embodiment are not limited to the bands in FIG. 2, and other bands are possible as one of ordinary skill will recognize.

[1.3 Other]

As described above, the radio-frequency circuit 1 according to the first embodiment includes the filter 61 and the power amplifier 11 connected to the filter 61. The filter 61 has a pass band including band A2 for the cellular communication system and band B1 and/or band B2 for the satellite communication system. Band B1 and/or band B2 are positioned between band A2 and band C1 for the satellite navigation system.

With this configuration, the radio-frequency circuit 1 includes the filter 61 having a pass band including band A2 for the cellular communication system and band B1 and/or band B2 for the satellite communication system. The radio-frequency circuit 1 thus requires fewer filters than when filters are individually provided for band A2 and for band B1 and/or band B2. The radio-frequency circuit 1 also includes the power amplifier 11 connected to the filter 61 configured as described above. The radio-frequency circuit 1 thus requires fewer power amplifiers than when power amplifiers are individually provided for band A2 and for band B1 and/or band B2. Hence, the use of the radio-frequency circuit 1 can reduce the number of components of a radio-frequency module that supports both the cellular communication system and the satellite communication system and thus, may not increase the size of the communication apparatus 5.

In the radio-frequency circuit 1 according to the first exemplary embodiment, band A2 and band B1 and/or band B2 may be frequency bands that can be used for sending a signal.

This enables the radio-frequency circuit 1 to send a radio-frequency signal in the cellular communication system and also to send a radio-frequency signal in the satellite communication system.

In the radio-frequency circuit 1 according to the first exemplary embodiment, the power amplifier 11 may have first and second amplification modes. A system for adjusting at least one of a power supply voltage and a bias signal to be supplied to the power amplifier 11 is different between the first and second amplification modes. When a sending signal of band A2 is to be amplified, the first amplification mode may be applied to the power amplifier 11. When a sending signal of band B1 and/or band B2 are to be amplified, the second amplification mode may be applied to the power amplifier 11.

With this configuration, the amplification mode of the power amplifier 11 can be switched between the cellular communication system and the satellite communication system. This makes it possible to use the amplification mode suitable for the cellular communication system and that for the satellite communication system, thereby reducing power consumption and/or distortion of a signal in the power amplifier 11.

In the radio-frequency circuit 1 according to the first exemplary embodiment, the ET system may be used for one of the first and second amplification modes, while the APT system may be used for the other one of the first and second amplification modes.

This configuration makes it possible to switch between the ET system and the APT system in accordance with whether the cellular communication system or the satellite communication system is employed. It is thus possible to reduce power consumption and/or distortion of a signal in the power amplifier 11 in accordance with the communication system used in the radio-frequency circuit 1.

In the radio-frequency circuit 1 according to the first embodiment, the ET system may be used for the first amplification mode, while the APT system may be used for the second amplification mode.

With this configuration, the ET mode can be used as the power amplification mode for the cellular communication system, while the APT mode can be used as the power amplification mode for the satellite communication system. It can be assumed that the previous-generation older communication system is used for satellite communication. The APT mode is thus used for the power amplifier 11 when satellite communication is performed, thereby making it possible to control the power amplifier 11 more suitably. In contrast, it can be assumed that the latest communication system is used for cellular communication. The ET mode is thus used for the power amplifier 11 when cellular commination is performed, thereby making it possible to control the power amplifier 11 more suitably.

The radio-frequency circuit 1 according to the first embodiment may also include the filter 62 and the low-noise amplifier 21 connected to the filter 62. The filter 62 has a pass band including band A1 which is used for the cellular communication system and which is available for receiving a signal.

With this configuration, the radio-frequency circuit 1 can also receive a signal of band A1 for the cellular communication system.

In the radio-frequency circuit 1 according to the first exemplary embodiment, band A1 and band A2 are a downlink operating band and an uplink operating band, respectively, included in the same FDD band. Band B1 and/or band B2 and band C1 may be positioned between band A1 and band A2.

With this configuration, band B1 and/or band B2 are positioned between the downlink operating band and the uplink operating band included in the same FDD band. Accordingly, band A2 and band B1 and/or band B2 are positioned relatively close to each other. It is thus unlikely that electrical characteristics, such as noise figure (NF) and gain characteristics, of the radio-frequency circuit 1 are degraded, which would otherwise be caused by the use of the same filter 61 and the same power amplifier 11 for band A2 and band B1 and/or band B2.

The radio-frequency circuit 1 according to the first exemplary embodiment may also include the switch 51. The switch 51 is connected between the input terminal of the power amplifier 11 and the radio-frequency input terminals 111 and 112. The radio-frequency input terminal 111 is an external connection terminal for receiving a sending signal of band A2. The radio-frequency input terminal 112 is an external connection terminal for receiving a sending signal of band B1 and/or band B2.

With this configuration, the radio-frequency circuit 1 can receive a sending signal of band A2 and a sending signal of band B1 and/or a sending signal of band B2 from the RFIC 3 via different radio-frequency input terminals.

In the radio-frequency circuit 1 according to the first exemplary embodiment, the switch 51 may be able to selectively connect the power amplifier 11 to the radio-frequency input terminal 111 or to the radio-frequency input terminal 112.

With this configuration, the radio-frequency circuit 1 can switch between the radio-frequency input terminals 111 and 112 in accordance with whether the cellular communication system or the satellite communication system is employed.

In the radio-frequency circuit 1 according to the first exemplary embodiment, band A1 may be the downlink operating band of LTE Band 24 or 5G NR n24, and band A2 may be the uplink operating band of LTE Band 24 or 5G NR n24. Band B1 may be a frequency band of 1610 to 1621.35 MHz. Band C1 may be a frequency band of 1563 to 1587 MHz.

The radio-frequency circuit 1 can use the above-described frequency bands as band A1, band A2, band B1, and band C1.

The communication apparatus 5 according to the first exemplary embodiment includes the RFIC 3 that processes a radio-frequency signal and the radio-frequency circuit 1 that transmits the radio-frequency signal between the antenna 2 and the RFIC 3.

The communication apparatus 5 thus achieves advantages similar to those obtained by the radio-frequency circuit 1.

Second Exemplary Embodiment

A second Exemplary embodiment will now be described below. The second exemplary embodiment differs from the first exemplary embodiment in that different filters are used for band A2 and band B and in that a receive path for band C1 is provided. The second exemplary embodiment will be described below with reference to FIG. 3 mainly by referring to the points different from the first exemplary embodiment.

[2.1 Circuit Configurations of Radio-Frequency Circuit 1A and Communication Apparatus 5A]

Figure 3:
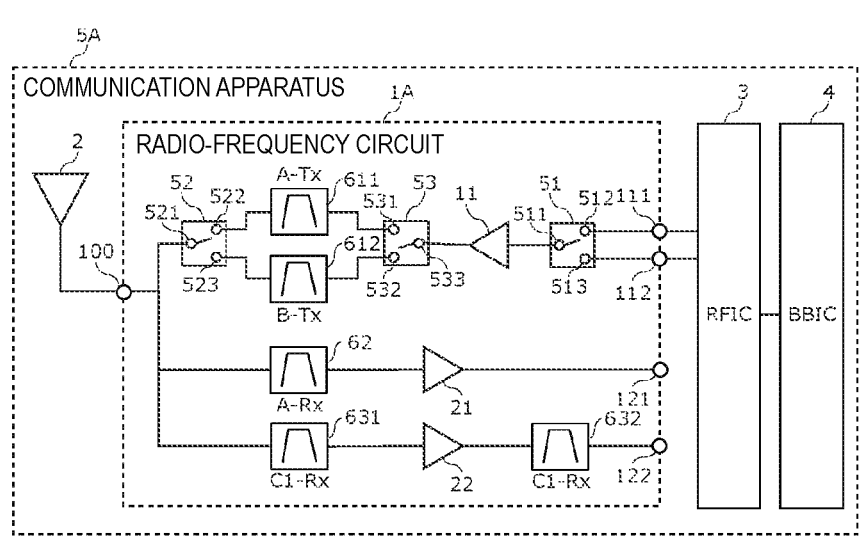
FIG. 3 is a circuit diagram of a radio-frequency circuit and a communication apparatus according to a second exemplary embodiment.

The circuit configurations of a radio-frequency circuit 1A and a communication apparatus 5A according to the second exemplary embodiment will be discussed below with reference to FIG. 3. FIG. 3 is a circuit diagram of the radio-frequency circuit 1A and the communication apparatus 5A according to the second exemplary embodiment.

[2.1.1 Circuit Configuration of Communication Apparatus 5A]

As illustrated in FIG. 3, the communication apparatus 5A according to the second exemplary embodiment includes the radio-frequency circuit 1A, an antenna 2, an RFIC 3, and a BBIC 4. The circuit configuration of the communication apparatus 5A is similar to that of the communication apparatus 5 of the first exemplary embodiment, except for the radio-frequency circuit 1A, and an explanation thereof will thus be omitted.

[2.1.2 Circuit Configuration of Radio-Frequency Circuit 1A]

The circuit configuration of the radio-frequency circuit 1A will be explained below. As illustrated in FIG. 3, the radio-frequency circuit 1A includes a power amplifier 11, low-noise amplifiers 21 and 22, switches 51, 52, and 53, filters 611, 612, 62, 631, and 632, an antenna connecting terminal 100, radio-frequency input terminals 111 and 112, and radio-frequency output terminals 121 and 122.

The radio-frequency output terminal 122 is an external connection terminal for outputting a received signal of band C1. The radio-frequency output terminal 122 is connected to the RFIC 3.

The low-noise amplifier 22 is an example of a second low-noise amplifier. The low-noise amplifier 22 can amplify a radio-frequency received signal received via the antenna connecting terminal 100. In this example, the low-noise amplifier 22 can amplify a received signal of band C1 received from the antenna connecting terminal 100 via the filter 631. A radio-frequency signal amplified by the low-noise amplifier 22 is output to the radio-frequency output terminal 122. The internal configuration of the low-noise amplifier 22 is not limited to a particular configuration.

The switch 52 is connected between the antenna connecting terminal 100 and the filters 611 and 612. An exemplary configuration of the switch 52 is as follows. The switch 52 has terminals 521, 522, and 523. The terminal 521 is connected to the antenna connecting terminal 100. The terminal 522 is connected to the filter 611, while the terminal 523 is connected to the filter 612.

With this connection configuration, the switch 52 can connect one of the terminals 522 and 523 to the terminal 521, based on a control signal from the RFIC 3, for example. That is, the switch 52 can selectively connect the antenna connecting terminal 100 to the filter 611 or to the filter 612. The switch 52 may be an SPDT switch circuit, for example, but other types of switches may also be used without departing from the scope of the present disclosure.

The switch 53 is an example of a first switch. The switch 53 is connected between the power amplifier 11 and the filters 611 and 612. An exemplary configuration of the switch 53 is as follows. The switch 53 has terminals 531, 532, and 533. The terminal 531 is connected to the filter 611, while the terminal 532 is connected to the filter 612. The terminal 533 is connected to the output terminal of the power amplifier 11.

With this connection configuration, the switch 53 can connect one of the terminals 531 and 532 to the terminal 533, based on a control signal from the RFIC 3, for example. That is, the switch 53 can selectively connect the power amplifier 11 to the filter 611 or to the filter 612. In other words, the power amplifier 11 can be connected to the filters 611 and 612 via the switch 53. The switch 53 may be an SPDT switch circuit, for example, but other switch types are possible without departing from the scope of the present disclosure.

The filter 611 (A-Tx) is an example of a second filter and is connected between the switches 52 and 53. Among the radio-frequency signals amplified by the power amplifier 11, the filter 611 allows sending signals of band A2 to pass therethrough. That is, the filter 611 has a pass band including band A2.

The filter 612 (B-Tx) is an example of a third filter and is connected between the switches 52 and 53. Among the radio-frequency signals amplified by the power amplifier 11, the filter 612 allows sending signals of band B to pass therethrough. That is, the filter 612 has a pass band including band B.

The filter 631 (C1-Rx) is an example of a fifth filter, and the filter 632 (C1-Rx) is an example of a sixth filter. The filters 631 and 632 each have a pass band including band C1. One end of the filter 631 is connected to the antenna connecting terminal 100, and the other end thereof is connected to the input terminal of the low-noise amplifier 22. One end of the filter 632 is connected to the output terminal of the low-noise amplifier 22, and the other end thereof is connected to the radio-frequency output terminal 122.

Each of the filters 611, 612, 631, and 632 may be any one of a SAW filter, a BAW filter, an LC resonance filter, and a dielectric filter. The filters 611, 612, 631, and 632 may be filters other than these types of filters.

The provision of some of the circuit elements shown in FIG. 3 in the radio-frequency circuit 1A may be omitted. For example, it is sufficient that the radio-frequency circuit 1A includes at least the power amplifier 11, the switch 53, and the filters 611 and 612. The low-noise amplifiers 21 and 22, the switches 51 and 52, and the filters 62 and 631 may be omitted.

[2.2 Other]

As described above, the radio-frequency circuit 1A according to the second exemplary embodiment includes the filters 611 and 612, the switch 53, and the power amplifier 11. The filter 611 has a pass band including band A2 for the cellular communication system. The filter 612 has a pass band including band B1 and/or band B2 for the satellite communication system. Band B1 and/or band B2 are positioned between band A2 and band C1 for the satellite navigation system. The switch 53 is connected to the filters 611 and 612. The power amplifier 11 is connected to the filters 611 and 612 via the switch 53.

With this configuration, the radio-frequency circuit 1A includes the power amplifier 11 which is connected via the switch 53 to the filter 611 having a pass band including band A2 for the cellular communication system and to the filter 612 having a pass band including band B1 and/or band B2 for the satellite communication system. The radio-frequency circuit 1A thus requires fewer power amplifiers than when power amplifiers are individually provided for band A2 and for band B1 and/or band B2. Hence, the use of the radio-frequency circuit 1A can reduce the number of components of a radio-frequency module that supports both the cellular communication system and the satellite communication system and can thus reduce potential size increases of the communication apparatus 5A.

The radio-frequency circuit 1A according to the second exemplary embodiment may also include the filters 631 and 632 and the low-noise amplifier 22. The filters 631 and 632 each have a pass band including band C1. The input terminal of the low-noise amplifier 22 may be connected to the filter 631, and the output terminal thereof may be connected to the filter 632.

With this configuration, the radio-frequency circuit 1A can also receive a signal of band C1 for the satellite navigation system.

Third Exemplary Embodiment

A third exemplary embodiment will now be described below. The third exemplary embodiment differs from the second embodiment in the receive path for band C. The third exemplary embodiment will be described below with reference to FIGS. 4 through 6 mainly by referring to the points different from the second exemplary embodiment.

[3.1 Circuit Configurations of Radio-Frequency Circuit 1B and Communication Apparatus 5B]

Figure 4:
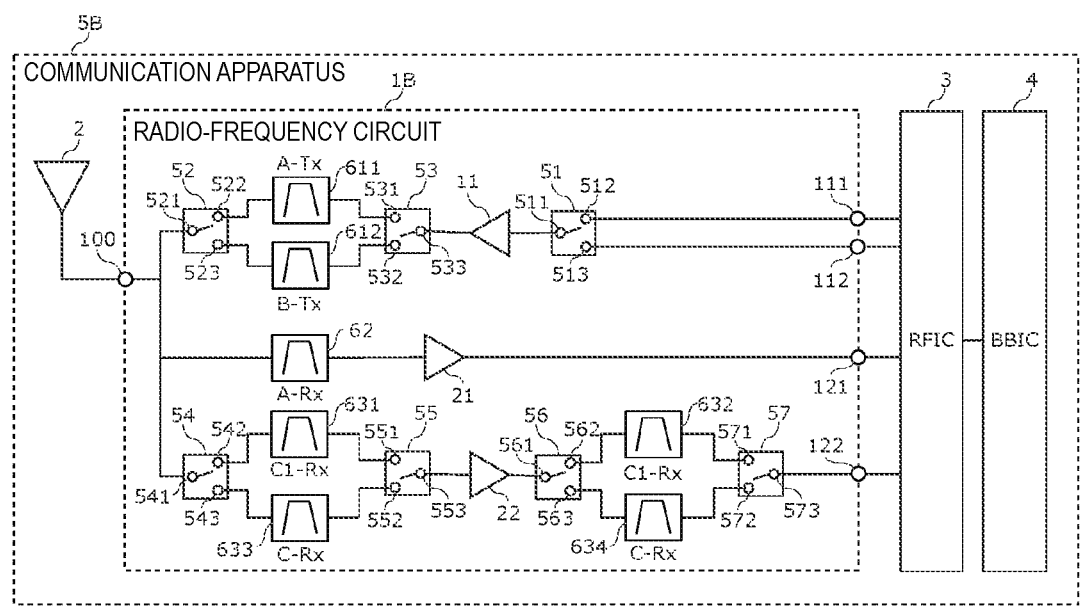
FIG. 4 is a circuit diagram of a radio-frequency circuit and a communication apparatus according to a third exemplary embodiment.

The circuit configurations of a radio-frequency circuit 1B and a communication apparatus 5B according to the third exemplary embodiment will be described below with reference to FIG. 4. FIG. 4 is a circuit diagram of the radio-frequency circuit 1B and the communication apparatus 5B according to the third exemplary embodiment.

[3.1.1 Circuit Configuration of Communication Apparatus 5B]

As illustrated in FIG. 4, the communication apparatus 5B according to the third exemplary embodiment includes the radio-frequency circuit 1B, an antenna 2, an RFIC 3, and a BBIC 4. The circuit configuration of the communication apparatus 5B is similar to that of the communication apparatus 5 of the first exemplary embodiment, except for the radio-frequency circuit 1B, and an explanation thereof will thus be omitted.

[3.1.2 Circuit Configuration of Radio-Frequency Circuit 1B]

The circuit configuration of the radio-frequency circuit 1B will be explained below. As illustrated in FIG. 4, the radio-frequency circuit 1B includes a power amplifier 11, low-noise amplifiers 21 and 22, switches 51 through 57, filters 611, 612, 62, 631, 632, 633, and 634, an antenna connecting terminal 100, radio-frequency input terminals 111 and 112, and radio-frequency output terminals 121 and 122.

The switch 54 is connected between the antenna connecting terminal 100 and the filters 631 and 633. An exemplary configuration of the switch 54 is as follows. The switch 54 has terminals 541, 542, and 543. The terminal 541 is connected to the antenna connecting terminal 100. The terminal 542 is connected to the filter 631, while the terminal 543 is connected to the filter 633.

With this connection configuration, the switch 54 can connect one of the terminals 542 and 543 to the terminal 541, based on a control signal from the RFIC 3, for example. That is, the switch 54 can selectively connect the antenna connecting terminal 100 to the filter 631 or to the filter 633. The switch 54 may be an SPDT switch circuit, for example, but other switch types are possible without departing from the scope of the present disclosure.

The switch 55 is an example of a second switch. The switch 55 is connected between the low-noise amplifier 22 and the filters 631 and 633. An exemplary configuration of the switch 55 is as follows. The switch 55 has terminals 551, 552, and 553. The terminal 551 is connected to the filter 631, while the terminal 552 is connected to the filter 633. The terminal 553 is connected to the input terminal of the low-noise amplifier 22.

With this connection configuration, the switch 55 can connect one of the terminals 551 and 552 to the terminal 553, based on a control signal from the RFIC 3, for example. That is, the switch 55 can selectively connect the low-noise amplifier 22 to the filter 631 or to the filter 633. In other words, the input terminal of the low-noise amplifier 22 can be connected to the filters 631 and 633 via the switch 55. The switch 55 may be an SPDT switch circuit, for example, but other switch types are possible without departing from the scope of the present disclosure.

The switch 56 is an example of a third switch. The switch 56 is connected between the low-noise amplifier 22 and the filters 632 and 634. An exemplary configuration of the switch 56 is as follows. The switch 56 has terminals 561, 562, and 563. The terminal 561 is connected to the output terminal of the low-noise amplifier 22. The terminal 562 is connected to the filter 632, while the terminal 563 is connected to the filter 634.

With this connection configuration, the switch 56 can connect one of the terminals 562 and 563 to the terminal 561, based on a control signal from the RFIC 3, for example. That is, the switch 56 can selectively connect the low-noise amplifier 22 to the filter 632 or to the filter 634. In other words, the output terminal of the low-noise amplifier 22 can be connected to the filters 632 and 634 via the switch 56. The switch 56 may be an SPDT switch circuit, for example, but other switch types are possible without departing from the present disclosure.

The switch 57 is connected between the filters 632 and 634 and the radio-frequency output terminal 122. An exemplary configuration of the switch 57 is as follows. The switch 57 has terminals 571, 572, and 573. The terminal 571 is connected to the filter 632, while the terminal 572 is connected to the filter 634. The terminal 573 is connected to the radio-frequency output terminal 122.

With this connection configuration, the switch 57 can connect one of the terminals 571 and 572 to the terminal 573, based on a control signal from the RFIC 3, for example. That is, the switch 57 can selectively connect the radio-frequency output terminal 122 to the filter 632 or to the filter 634. The switch 57 may be an SPDT switch circuit, for example, but other switch types are possible without departing from the scope of the present disclosure.

The filter 631 (C1-Rx) is an example of the fifth filter and has a pass band including band C1. One end of the filter 631 is connected to the antenna connecting terminal 100 via the switch 54, and the other end thereof is connected to the input terminal of the low-noise amplifier 22 via the switch 55.

The filter 632 (C1-Rx) is an example of the sixth filter and has a pass band including band C1. One end of the filter 632 is connected to the output terminal of the low-noise amplifier 22 via the switch 56, and the other end thereof is connected to the radio-frequency output terminal 122 via the switch 57.

The filter 633 (C-Rx) is an example of a seventh filter and has a pass band including band C1 and band C2. In the third exemplary embodiment, band C2 is an example of a fifth band. One end of the filter 633 is connected to the antenna connecting terminal 100 via the switch 54, and the other end thereof is connected to the input terminal of the low-noise amplifier 22 via the switch 55.

The filter 634 (C-Rx) is an example of an eighth filter. One end of the filter 634 is connected to the output terminal of the low-noise amplifier 22 via the switch 56, and the other end thereof is connected to the radio-frequency output terminal 122 via the switch 57.

Each of the filters 631 through 634 may be any one of a SAW filter, a BAW filter, an LC resonance filter, and a dielectric filter. The filters 631 through 634 may also be filters other than these types of filters as one of ordinary skill would recognize.

The provision of some of the circuit elements shown in FIG. 4 in the radio-frequency circuit 1B may be omitted. For example, the provision of circuit elements, such as the switches 54 and 57, in the radio-frequency circuit 1B may be omitted.

[3.2 Signal Flow in Communication Apparatus 5B and Radio-Frequency Circuit 1B]

Figure 5:
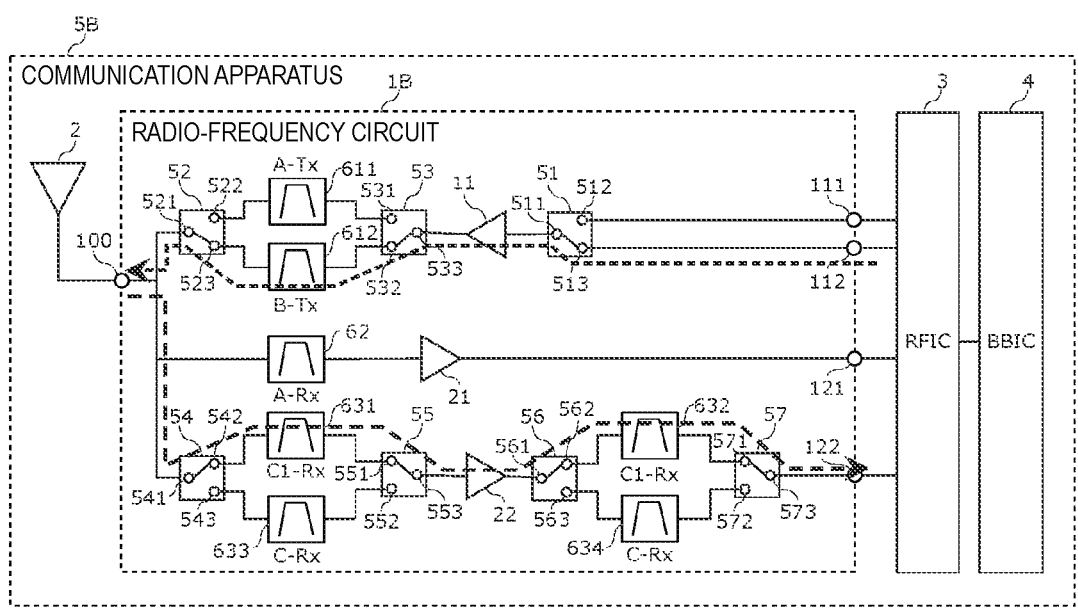
FIG. 5 illustrates a signal flow in the communication apparatus according to the third exemplary embodiment.
Figure 6:
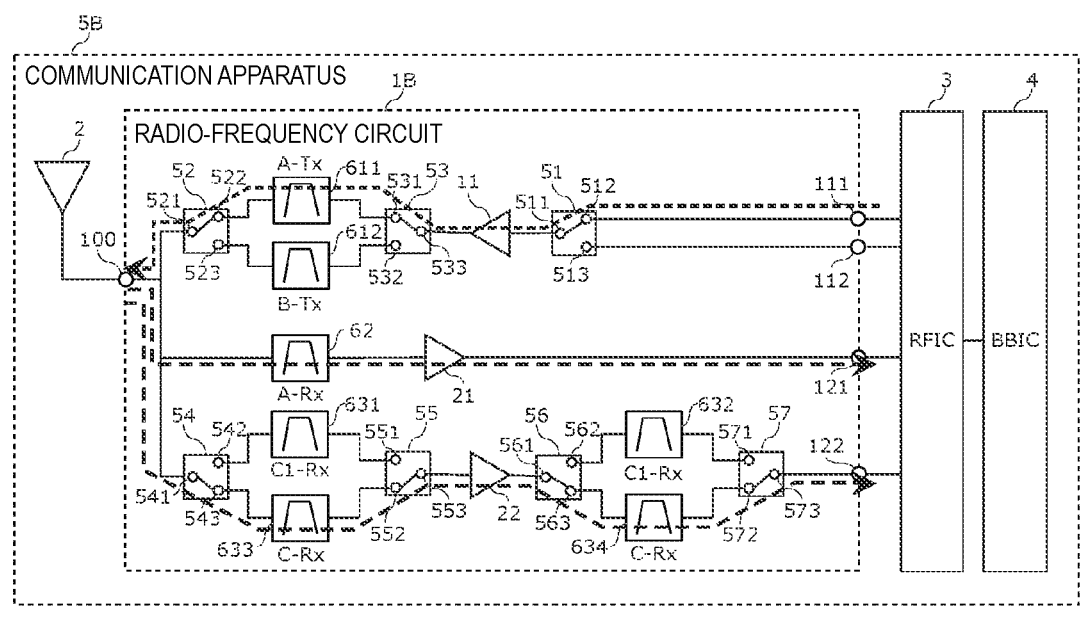
FIG. 6 illustrates another signal flow in the communication apparatus according to the third exemplary embodiment.

A signal flow in the communication apparatus 5B and the radio-frequency circuit 1B will be discussed below with reference to FIGS. 5 and 6. Each of FIGS. 5 and 6 is a circuit diagram illustrating a signal flow in the communication apparatus 5B according to the third exemplary embodiment. In FIGS. 5 and 6, the broken-line arrows indicate a signal flow.

In the radio-frequency circuit 1B, when band B is being used for communication, as illustrated in FIG. 5, the RFIC 3, for example, causes the switch 51 to connect the terminal 511 to the terminal 513. The RFIC 3 also causes the switch 53 to connect the terminal 533 to the terminal 532 and the switch 52 to connect the terminal 521 to the terminal 523. This transmits a sending signal of band B from the RFIC 3 to the antenna 2 via the radio-frequency input terminal 112, switch 51, power amplifier 11, switch 53, filter 612, switch 52, and antenna connecting terminal 100.

At the same time, as illustrated in FIG. 5, the RFIC 3, for example, also causes the switch 54 to connect the terminal 541 to the terminal 542, the switch 55 to connect the terminal 553 to the terminal 551, the switch 56 to connect the terminal 561 to the terminal 562, and the switch 57 to connect the terminal 573 to the terminal 571. This transmits a received signal of band C1 from the antenna 2 to the RFIC 3 via the switch 54, filter 631, switch 55, low-noise amplifier 22, switch 56, filter 632, switch 57, and radio-frequency output terminal 122. That is, the communication apparatus 5B allows for the use of band C1 and stops the use of band C2.

In the radio-frequency circuit 1B, when band B is not being used for communication, as illustrated in FIG. 6, the RFIC 3, for example, causes the switch 51 to connect the terminal 511 to the terminal 512. The RFIC 3 also causes the switch 53 to connect the terminal 533 to the terminal 531 and the switch 52 to connect the terminal 521 to the terminal 522. This transmits a sending signal of band A from the RFIC 3 to the antenna 2 via the radio-frequency input terminal 111, switch 51, power amplifier 11, switch 53, filter 611, switch 52, and antenna connecting terminal 100.

At the same time, as illustrated in FIG. 6, the RFIC 3, for example, also causes the switch 54 to connect the terminal 541 to the terminal 543, the switch 55 to connect the terminal 553 to the terminal 552, the switch 56 to connect the terminal 561 to the terminal 563, and the switch 57 to connect the terminal 573 to the terminal 572. This transmits received signals of band C1 and band C2 from the antenna 2 to the RFIC 3 via the switch 54, filter 633, switch 55, low-noise amplifier 22, switch 56, filter 634, switch 57, and radio-frequency output terminal 122. That is, the communication apparatus 5B allows for the use of band C1 and band C2.

[3.3 Other]

As described above, the radio-frequency circuit 1B according to the third exemplary embodiment may include the filters 633 and 634 and switches 55 and 56. The filters

633 and 634 each have a pass band including band C1 and band C2 for the satellite navigation system. The filter 55 is connected to the filters 631 and 633, while the filter 56 is connected to the filters 632 and 634. The input terminal of the low-noise amplifier 22 is connected to the filters 631 and 633 via the switch 55. The output terminal of the low-noise amplifier 22 is connected to the filters 632 and 634 via the switch 56.

With this configuration, the radio-frequency circuit 1B can also receive a signal of band C2 for the satellite navigation system.

In the radio-frequency circuit 1B according to the third exemplary embodiment, when band B1 and/or band B2 are being used for communication, the switch 55 may connect the input terminal of the low-noise amplifier 22 to the filter 631, and the switch 56 may connect the output terminal of the low-noise amplifier 22 to the filter 632. When band B1 and/or band B2 are not being used for communication, the switch 55 may connect the input terminal of the low-noise amplifier 22 to the filter 633, and the switch 56 may connect the output terminal of the low-noise amplifier 22 to the filter 634.

With this configuration, the radio-frequency circuit 1B can stop the use of band C2 when band B1 and/or band B2 are being used for communication and can allow for the use of band C2 when band B1 and/or band B2 are not being used for communication. It is thus possible to reduce the interference between band C2 and band B1 and/or band B2 and to make it less likely to degrade the quality of band C2 and that of band B1 and/or band B2.

In the radio-frequency circuit 1B according to the third exemplary embodiment, band C2 may be a frequency band of 1593 to 1610 MHz. However, other frequency bands are possible as one of ordinary skill would recognize.

With this configuration, the radio-frequency circuit 1B can use this frequency band as band C2.

Fourth Exemplary Embodiment

A fourth exemplary embodiment will now be described below. The fourth exemplary embodiment differs from the first through third exemplary embodiments in the following point. In the first through third exemplary embodiments, the same power amplifier 11 is used for band A2 and band B1 and/or band B2. In the fourth exemplary embodiment, the same low-noise amplifier is used for band A1 and band C1 and/or band C2. That is, in the fourth exemplary embodiment, band A1 corresponds to the first band, band C1 corresponds to the second band, and band B1 and/or band B2 correspond to the third band. The fourth exemplary embodiment will be described below with reference to FIG. 7 mainly by referring to the points different from the first exemplary embodiment.

[4.1 Circuit Configurations of Radio-Frequency Circuit 1C and Communication Apparatus 5C]

Figure 7:
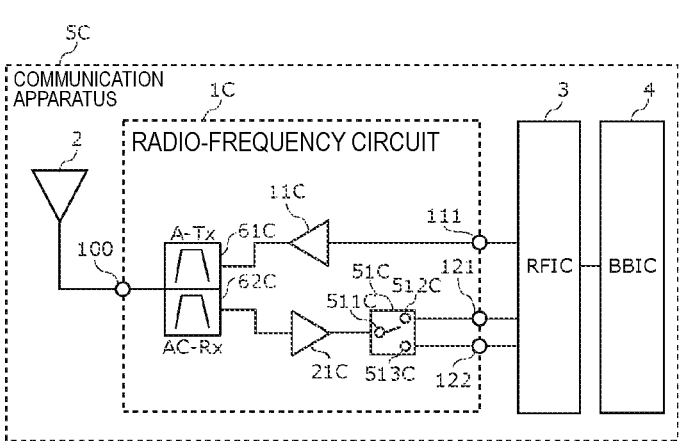
FIG. 7 is a circuit diagram of a radio-frequency circuit and a communication apparatus according to a fourth exemplary embodiment.

The circuit configurations of a radio-frequency circuit 1C and a communication apparatus 5C according to the fourth exemplary embodiment will be described below with reference to FIG. 7. FIG. 7 is a circuit diagram of the radio-frequency circuit 1C and the communication apparatus 5C according to the fourth exemplary embodiment.

[4.1.1 Circuit Configuration of Communication Apparatus 5C]

As illustrated in FIG. 7, the communication apparatus 5C according to the fourth exemplary embodiment includes the radio-frequency circuit 1C, an antenna 2, an RFIC 3, and a BBIC 4. The circuit configuration of the communication apparatus 5C is similar to that of the communication apparatus 5 of the first exemplary embodiment, except for the radio-frequency circuit 1C, and an explanation thereof will thus be omitted.

[4.1.2 Circuit Configuration of Radio-Frequency Circuit 1C]

The circuit configuration of the radio-frequency circuit 1C will now be described below. As illustrated in FIG. 7, the radio-frequency circuit 1C includes a power amplifier 11C, a low-noise amplifier 21C, a switch 51C, filters 61C and 62C, an antenna connecting terminal 100, a radio-frequency input terminal 111, and radio-frequency output terminals 121 and 122.

The power amplifier 11C can amplify a radio-frequency sending signal received from the RFIC 3. The power amplifier 11C is connected to the radio-frequency input terminal 111 so that it can amplify a sending signal of band A received from the RFIC 3 via the radio-frequency input terminal 111.

The low-noise amplifier 21C can amplify a radio-frequency received signal received via the antenna connecting terminal 100. In this example, the low-noise amplifier 21C can amplify received signals of band A and band C received from the antenna connecting terminal 100 via the filter 62C. A radio-frequency signal amplified by the low-noise amplifier 21C is selectively output to the radio-frequency output terminal 121 or 122 via the switch 51C.

The switch 51C is an example of a fifth switch. The switch 51C is connected between the radio-frequency output terminals 121 and 122 and the low-noise amplifier 21C. An exemplary configuration of the switch 51C is as follows. The switch 51C has terminals 511C, 512C, and 513C. The terminal 511C is connected to the output terminal of the low-noise amplifier 21C. The terminal 512C is connected to the radio-frequency output terminal 121, while the terminal 513C is connected to the radio-frequency output terminal 122.

With this connection configuration, the switch 51C can connect one of the terminals 512C and 513C to the terminal 511C, based on a control signal from the RFIC 3, for example. That is, the switch 51C can selectively connect the low-noise amplifier 21C to the radio-frequency output terminal 121 or to the radio-frequency output terminal 122. The switch 51C may be an SPDT switch circuit, for example, but other switch types are possible without departing from the scope of the present disclosure.

The filter 61C (A-Tx) is connected between the power amplifier 11C and the antenna connecting terminal 100. Among the radio-frequency signals amplified by the power amplifier 11C, the filter 61C allows sending signals of band A2 to pass therethrough. That is, the filter 61C has a pass band including band A2.

The filter 62C (AC-Rx) is an example of the first filter. The filter 62C is connected between the low-noise amplifier 21C and the antenna connecting terminal 100. Among the radio-frequency signals received by the antenna 2, the filter 62C allows received signals of band A1 and band C1 to pass therethrough. That is, the filter 62C has a pass band including band A1 band C1.

Each of the filters 61C and 62C may be any one of a SAW filter, a BAW filter, an LC resonance filter, and a dielectric filter. The filters 61C and 62C may be filters other than these types of filters.

The provision of some of the circuit elements shown in FIG. 7 in the radio-frequency circuit 1C may be omitted. For example, the provision of circuit elements, such as the power amplifier 11C and the filter 61C, may be omitted.

[4.2 Other]

As described above, the radio-frequency circuit 1C according to the fourth exemplary embodiment includes the filter 62C and the low-noise amplifier 21C connected to the filter 62C. The filter 62C has a pass band including band A1 for the cellular communication system and band C1 for the satellite navigation system. Band C1 is positioned between band A1 and band B1 and/or band B2 for the satellite communication system. Band A1 and band C1 are frequency bands that can be used for receiving a signal.

With this configuration, the radio-frequency circuit 1C includes the filter 62C having a pass band including band A1 for the cellular communication system and band C1 for the satellite navigation system. The radio-frequency circuit 1C thus requires fewer filters than when filters are individually provided for band A1 and for band C1. The radio-frequency circuit 1C also includes the low-noise amplifier 21C connected to the filter 62C configured as described above. The radio-frequency circuit 1C thus requires fewer low-noise amplifiers than when low-noise amplifiers are individually provided for band A1 and for band C1. Hence, the use of the radio-frequency circuit 1C can reduce the number of components of a radio-frequency module that supports reception of both the cellular communication system and the satellite navigation system and can accordingly eliminate or reduce an increase in size of the communication apparatus 5C.

The radio-frequency circuit 1C according to the fourth exemplary embodiment may also include the switch 51C connected between the output terminal of the low-noise amplifier 21C and the radio-frequency output terminals 121 and 122. The radio-frequency output terminal 121 is a terminal for outputting a received signal of band A1 to the outside of the radio-frequency circuit 1C. The radio-frequency output terminal 122 is a terminal for outputting a received signal of band C1 to the outside of the radio-frequency circuit 1C.

With this configuration, the radio-frequency circuit 1C can output a received signal of band A1 and a received signal of band C1 to the RFIC 3 via different radio-frequency output terminals.

In the radio-frequency circuit 1C according to the fourth embodiment, the switch 51C may be able to selectively connect the low-noise amplifier 21C to the radio-frequency output terminal 121 or to the radio-frequency output terminal 122.

With this configuration, the radio-frequency circuit 1C can switch between the radio-frequency output terminals 121 and 122 in accordance with whether the cellular communication system or the satellite navigation system is employed.

In the radio-frequency circuit 1C according to the fourth embodiment, band A1 may be the downlink operating band of LTE Band 24 or 5G NR n24. Band C1 may be a frequency band of 1563 to 1587 MHz. Band B1 may be a frequency band of 1610 to 1621.35 MHz. Of course, bands C1 and B1 may also be bands different from these, as one of ordinary skill would recognize.

With this configuration, the radio-frequency circuit 1C can use the above-described specific frequency bands as band A1, band B1, and band C1.

Fifth Exemplary Embodiment

A fifth exemplary embodiment will now be described below. In the fifth exemplary embodiment, bands used as the first band and the second band are different from those of the first through fourth exemplary embodiments. The fifth exemplary embodiment will be described below with reference to FIGS. 8 through 10B mainly by referring to the points different from the first exemplary embodiment.

In the fifth exemplary embodiment, as the first band for the cellular communication system, LTE Band 53 or 5G NR n53 (band A3: 2483.5 to 2495 MHz) is used. As the second band for the satellite communication system, another frequency band for Globalstar satellite system (band B3: 2483.5 to 2495 MHz) is used. In this example, the second band matches the first band.

[5.1 Circuit Configurations of Radio-Frequency Circuit 1D and Communication Apparatus 5D]

Figure 8:
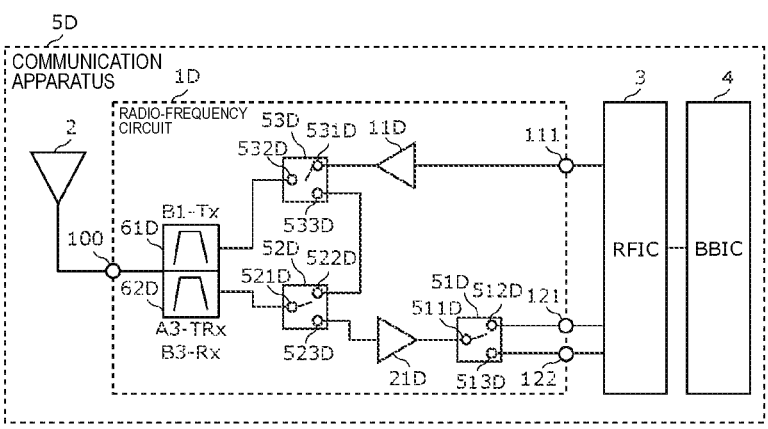
FIG. 8 is a circuit diagram of a radio-frequency circuit and a communication apparatus according to a fifth exemplary embodiment.

The circuit configurations of a radio-frequency circuit 1D and a communication apparatus 5D according to the fifth exemplary embodiment will be described below with reference to FIG. 8. FIG. 8 is a circuit diagram of the radio-frequency circuit 1D and the communication apparatus 5D according to the fifth exemplary embodiment.

[5.1.1 Circuit Configuration of Communication Apparatus 5D]

As illustrated in FIG. 8, the communication apparatus 5D according to the fifth exemplary embodiment includes the radio-frequency circuit 1D, an antenna 2, an RFIC 3, and a BBIC 4. The circuit configuration of the communication apparatus 5D is similar to that of the communication apparatus 5 of the first exemplary embodiment, except for the radio-frequency circuit 1D, and an explanation thereof will thus be omitted.

[5.1.2 Circuit Configuration of Radio-Frequency Circuit 1D]

The circuit configuration of the radio-frequency circuit 1D will now be explained below. As illustrated in FIG. 8, the radio-frequency circuit 1D includes a power amplifier 11D, a low-noise amplifier 21D, switches 51D, 52D, and 53D, filters 61D and 62D, an antenna connecting terminal 100, a radio-frequency input terminal 111, and radio-frequency output terminals 121 and 122.

The power amplifier 11D can amplify a radio-frequency sending signal received from the RFIC 3. The power amplifier 11D is connected to the radio-frequency input terminal 111 so that it can amplify sending signals of band A3 and band B1 received from the RFIC 3 via the radio-frequency input terminal 111.

The low-noise amplifier 21D can amplify a radio-frequency received signal received via the antenna connecting terminal 100. In this example, the low-noise amplifier 21D can amplify received signals of band A3 and band B3 received from the antenna connecting terminal 100 via the filter 62D. A radio-frequency signal amplified by the low-noise amplifier 21D is selectively output to the radio-frequency output terminal 121 or 122 via the switch 51D.

The switch 51D is an example of the fifth switch. The switch 51D is connected between the radio-frequency output terminals 121 and 122 and the low-noise amplifier 21D. An exemplary configuration of the switch 51D is as follows. The switch 51D has terminals 511D, 512D, and 513D. The terminal 511D is connected to the output terminal of the low-noise amplifier 21D. The terminal 512D is connected to the radio-frequency output terminal 121, while the terminal 513D is connected to the radio-frequency output terminal 122.

With this connection configuration, the switch 51D can connect one of the terminals 512D and 513D to the terminal 511D, based on a control signal from the RFIC 3, for example. That is, the switch 51D can selectively connect the low-noise amplifier 21D to the radio-frequency output terminal 121 or to the radio-frequency output terminal 122. The switch 51D may be an SPDT switch circuit, for example, but other switch types are possible without departing from the scope of the present disclosure.

The switch 52D is connected between the filter 62D and each of the power amplifier 11D and the low-noise amplifier 21D. An exemplary configuration of the switch 52D is as follows. The switch 52D has terminals 521D, 522D, and 523D. The terminal 521D is connected to the filter 62D. The terminal 522D is connected to the switch 53D, while the terminal 523D is connected to the input terminal of the low-noise amplifier 21D.

With this connection configuration, the switch 52D can connect one of the terminals 522D and 523D to the terminal 521D, based on a control signal from the RFIC 3, for example. That is, the switch 52D can selectively connect the filter 62D to the power amplifier 11D or to the low-noise amplifier 21D. The switch 52D may be an SPDT switch circuit, for example, but other switch types are possible without departing from the scope of the present disclosure.

The switch 53D is connected between the power amplifier 11D and the filters 61D and 62D. An exemplary configuration of the switch 53D is as follows. The switch 53D has terminals 531D, 532D, and 533D. The terminal 531D is connected to the output terminal of the power amplifier 11D. The terminal 532D is connected to the filter 61D. The terminal 533D is connected to the terminal 522D of the switch 52D.

With this connection configuration, the switch 53D can connect one of the terminals 532D and 533D to the terminal 531D, based on a control signal from the RFIC 3, for example. That is, the switch 53D can selectively connect the power amplifier 11D to the filter 61D or to the filter 62D. The switch 53D may be an SPDT switch circuit, for example, but other switch types are possible without departing from the scope of the present disclosure.

The filter 61D (B1-Tx) is connected between the power amplifier 11D and the antenna connecting terminal 100. Among the radio-frequency signals amplified by the power amplifier 11D, the filter 61D allows sending signals of band B1 to pass therethrough. That is, the filter 61D has a pass band including band B1.

The filter 62D (A3-TRx, B3-Rx) is an example of the first filter. The filter 62D is connected between the low-noise amplifier 21D and the antenna connecting terminal 100. Among the radio-frequency signals received by the antenna 2, the filter 62D allows received signals of band A3 and band B3 to pass therethrough. That is, the filter 62D has a pass band including band A3 and band B3.

Each of the filters 61D and 62D may be any one of a SAW filter, a BAW filter, an LC resonance filter, and a dielectric filter. The filters 61D and 62D may be filters other than these types of filters.

The provision of some of the circuit elements shown in FIG. 8 in the radio-frequency circuit 1D may be omitted. For example, the provision of circuit elements, such as the power amplifier 11D and the filter 61D, may be omitted.

[5.2 Signal Flow in Communication Apparatus 5D and Radio-Frequency Circuit 1D]

Figure 9:
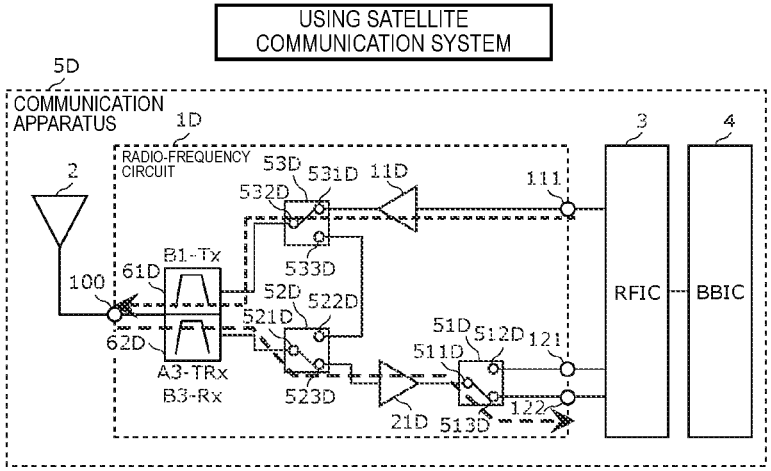
FIG. 9 illustrates a signal flow in the communication apparatus according to the fifth exemplary embodiment.
Figure 10A:
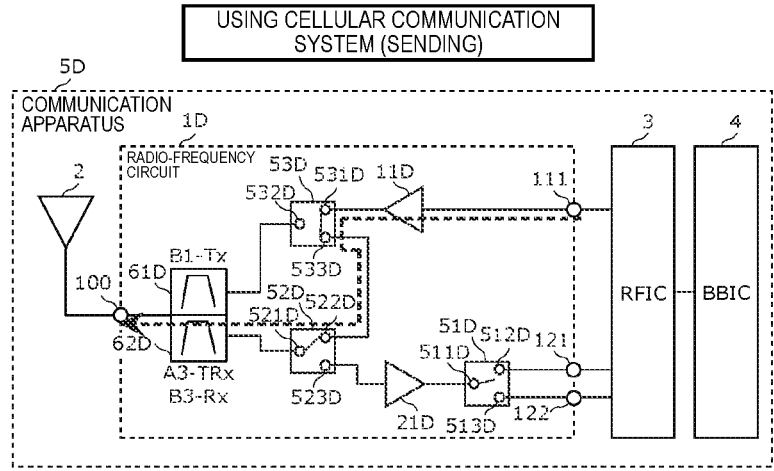
FIG. 10A illustrates another signal flow in the communication apparatus according to the fifth exemplary embodiment.
Figure 10B:
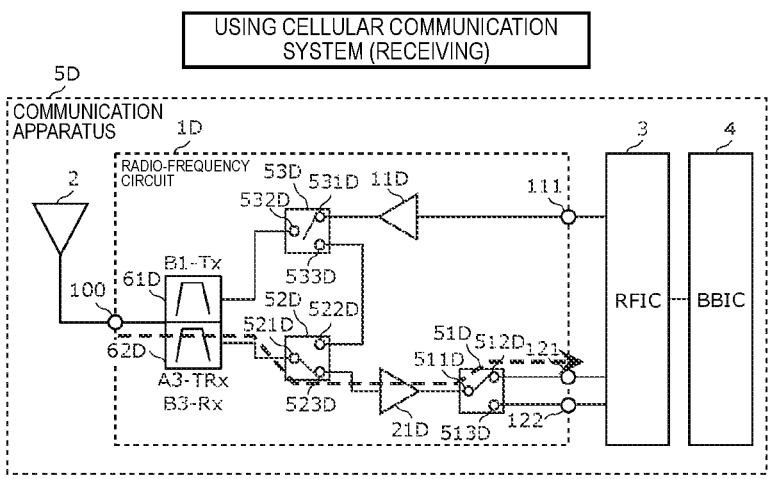
FIG. 10B illustrates another signal flow in the communication apparatus according to the fifth exemplary embodiment.

A signal flow in the communication apparatus 5D and the radio-frequency circuit 1D will be discussed below with reference to FIGS. 9, 10A, and 10B. Each of FIGS. 9, 10A, and 10B is a circuit diagram illustrating a signal flow in the communication apparatus 5D according to the fifth exemplary embodiment. In FIGS. 9, 10A, and 10B, the broken-line arrows indicate a signal flow.

In the radio-frequency circuit 1D, when the satellite communication system is used, as illustrated in FIG. 9, the RFIC 3, for example, causes the switch 51D to connect the terminal 511D to the terminal 513D. The RFIC 3 also causes the switch 52D to connect the terminal 521D to the terminal 523D and the switch 53D to connect the terminal 531D to the terminal 532D. This transmits a sending signal of band B1 from the RFIC 3 to the antenna 2 via the radio-frequency input terminal 111, power amplifier 11D, switch 53D, filter 61D, and antenna connecting terminal 100. This also transmits a received signal of band B3 from the antenna 2 to the RFIC 3 via the antenna connecting terminal 100, filter 62D, switch 52D, low-noise amplifier 21D, switch 51D, and radio-frequency output terminal 122.

In the radio-frequency circuit 1D, when the cellular communication system is used for sending a signal, as illustrated in FIG. 10A, the RFIC 3, for example, causes the switch 52D to connect the terminal 521D to the terminal 522D and the switch 53D to connect the terminal 531D to the terminal 533D. This transmits a sending signal of band A3 from the RFIC 3 to the antenna 2 via the radio-frequency input terminal 111, power amplifier 11D, switch 53D, switch 52D, filter 62D, and antenna connecting terminal 100.

In the radio-frequency circuit 1D, when the cellular communication system is used for receiving a signal, as illustrated in FIG. 10B, the RFIC 3, for example, causes the switch 51D to connect the terminal 511D to the terminal 512D and the switch 52D to connect the terminal 521D to the terminal 523D. This transmits a received signal of band A3 from the antenna 2 to the RFIC 3 via the antenna connecting terminal 100, filter 62D, switch 52D, low-noise amplifier 21D, switch 51D, and radio-frequency output terminal 121.

[5.3 Other]

As described above, the radio-frequency circuit 1D according to the fifth exemplary embodiment includes the filter 62D and the low-noise amplifier 21D connected to the filter 62D. The filter 62D has a pass band including band A3 for the cellular communication system and band B3 for the satellite communication system. In this example, Band A3 and band B3 match each other.

With this configuration, the radio-frequency circuit 1D includes the filter 62D having a pass band including band A3 for the cellular communication system and band B3 for the satellite communication system. The radio-frequency circuit 1D thus requires fewer filters than when filters are individually provided for band A3 and for band B3. The radio-frequency circuit 1D also includes the low-noise amplifier 21D connected to the filter 61D configured as described above. The radio-frequency circuit 1D thus requires fewer low-noise amplifiers than when low-noise amplifiers are individually provided for receiving a signal of band A3 and a signal of band B3. Hence, the use of the radio-frequency circuit 1D can reduce the number of components of a radio-frequency module that supports both the cellular communication system and the satellite communication system and can accordingly avoid or at least limit a size increase of the communication apparatus 5D.

In the radio-frequency circuit 1D according to the fifth embodiment, band A3 may be LTE Band 53 or 5G NR n53. Band B3 may be a frequency band of 2483.5 to 2500 MHZ.

With this configuration, the radio-frequency circuit 1D can use the above-described specific frequency bands as band A3 and band B3.

MODIFIED EXAMPLES

A modified example of the above-described embodiments will be described below. This modified example is different from the above-described embodiments mainly in that NTN bands are used as the first, second, and fourth bands. The modified example will be described below mainly by referring to the points different from the embodiments.

Specifically, NTN bands are used as the first and fourth bands for the cellular communication system, and an NTN band is also used as the second band (5GNR n201, for example) for the satellite communication system.

For example, the uplink operating band of 5GNR n255 can be used as the first band, while the downlink operating band of 5GNR n255 can be used as the fourth band. As the second band, the uplink operating band of 5GNR n201 can be used.

Other Exemplary Embodiments

The radio-frequency circuits and communication apparatuses have been discussed above through illustration of the embodiments. However, the disclosure is not restricted to the above-described embodiments. Other exemplary embodiments implemented by combining certain components in the above-described embodiments and other modified examples obtained by making various modifications to the above-described embodiments by those skilled in the art without departing from the scope and spirit of the disclosure are also encompassed herein. Various types of equipment integrating the above-described radio-frequency circuits and communication apparatuses are also encompassed by the present disclosure.

For example, in the circuit configurations of the radio-frequency circuits and communication apparatuses according to the exemplary embodiments, another circuit element and another wiring may be inserted onto a path connecting circuit elements and/or a path connecting signal paths illustrated in the drawings. For example, in the first exemplary embodiment, an impedance matching circuit may be inserted onto a path between the power amplifier 11 and the filter 61, a path between the low-noise amplifier 21 and the filter 62, a path between the antenna connecting terminal 100 and each of the filters 61 and 62, or a desired combination of these paths.

The present disclosure can be widely used for communication equipment, such as a cellular phone, as a radio-frequency circuit provided in a front-end device.

What is claimed is:

1. A radio-frequency circuit comprising:
a first filter circuit including a first pass band corresponding to a band of a cellular communication system and a second pass band corresponding to a band of a first satellite system;
a fourth filter circuit including a fourth pass band corresponding to the band of the cellular communication system and configured to receive a signal;
a first low-noise amplifier circuit connected to the fourth filter circuit; and
an amplifier circuit connected to the first filter circuit, wherein
the second pass band is positioned between the first pass band and a third pass band corresponding to a band of a second satellite system, or the second pass band at least partially matches the first pass band,
the first pass band and the second pass band are frequency bands through which a signal is sent; and
the amplifier circuit is a power amplifier circuit.

2. The radio-frequency circuit according to claim 1, wherein:
the power amplifier circuit has first and second amplification modes, a system configured to adjust at least one of a power supply voltage and a bias signal to be supplied to the power amplifier in accordance with the first amplification mode or the second amplification mode;

when a sending signal of the first band is to be amplified, the first amplification mode is applied to the power amplifier circuit; and when a sending signal of the second band is to be amplified, the second amplification mode is applied to the power amplifier circuit.

3. The radio-frequency circuit according to claim 2, wherein the system is configured to adjust the at least one of the power supply voltage and the bias signal based on:

envelope tracking when a current amplification mode is one of the first and second amplification modes; and average power tracking when the current amplification mode is another one of the first and second amplification modes.

4. The radio-frequency circuit according to claim 2, wherein the system is configured to adjust the at least one of the power supply voltage and the bias signal based on:

envelope tracking when a current amplification mode is the first amplification mode; and average power tracking when the current amplification mode is the second amplification mode.

5. The radio-frequency circuit according to claim 1, wherein:

the first pass band and the fourth pass band are an uplink operating band and a downlink operating band, respectively, included in an identical frequency division duplex (FDD) band; and the second pass band and the third pass band are positioned between the first pass band and the fourth pass band.

6. The radio-frequency circuit according to claim 1, further comprising:

fifth and sixth filter circuits each including the third pass band; and a second low-noise amplifier circuit including an input terminal connected to the fifth filter circuit and an output terminal connected to the sixth filter circuit.

7. The radio-frequency circuit according to claim 6, further comprising:

seventh and eighth filter circuits each including the third pass band and a fifth pass band corresponding to a band of a third satellite system;

a second switch connected to the fifth and seventh filter circuits; and a third switch connected to the sixth and eighth filter circuits, the input terminal of the second low-noise amplifier circuit being connected to the fifth and seventh filter circuits via the second switch, and the output terminal of the second low-noise amplifier circuit being connected to the sixth and eighth filter circuits via the third switch.

8. The radio-frequency circuit according to claim 7, wherein:

when the second pass band is used for communication, the second switch connects the input terminal of the second low-noise amplifier circuit to the fifth filter circuit, and the third switch connects the output terminal of the second low-noise amplifier circuit to the sixth filter circuit; and when the second pass band is not used for communication, the second switch connects the input terminal of the second low-noise amplifier circuit to the seventh filter circuit, and the third switch connects the output terminal of the second low-noise amplifier circuit to the eighth filter circuit.

9. The radio-frequency circuit according to claim 1, further comprising:

a fourth switch connected between an input terminal of the power amplifier circuit and each of first and second radio-frequency input terminals, the first radio-frequency input terminal being configured to receive a sending signal of the first pass band, the second radio-frequency input terminal being configured to receive a sending signal of the second pass band.

10. The radio-frequency circuit according to claim 9, wherein the fourth switch is configured to selectively connect the power amplifier circuit to the first radio-frequency input terminal or to the second radio-frequency input terminal.

11. A radio-frequency circuit, comprising:

a first filter circuit including a first pass band corresponding to a band of a cellular communication system and a second pass band corresponding to a band of a first satellite system; and an amplifier circuit connected to the first filter circuit, wherein the second pass band is positioned between the first pass band and a third pass band corresponding to a band of a second satellite system, or the second pass band at least partially matches the first pass band, the first pass band is an uplink operating band of Band 24 for Long Term Evolution (LTE), an uplink operating band of n24 for 5th Generation New Radio (5G NR), or an uplink operating band of n255 for 5G NR;

the second pass band is a frequency band of 1610 to 1621.35 MHz or an uplink operating band of n201 for 5G NR; and the third pass band is a frequency band of 1563 to 1587 MHz.

12. The radio-frequency circuit according to claim 1, wherein the fourth pass band is a downlink operating band of Band 24 for Long Term Evolution (LTE), a downlink operating band of n24 for $5^{th}$ Generation New Radio (5G NR), or a downlink operating band of n255 for 5G NR.

13. A radio-frequency circuit comprising:

a first filter circuit including a first pass band corresponding to a band of a cellular communication system and a second pass band corresponding to a band of a first satellite system; and an amplifier circuit connected to the first filter circuit, wherein the second pass band is positioned between the first pass band and a third pass band corresponding to a band of a second satellite system, or the second pass band at least partially matches the first pass band, the first pass band and the second pass band are frequency bands configured to receive a signal;

the amplifier circuit is a low-noise amplifier circuit; and the first pass band is Band 53 for Long Term Evolution (LTE) or n$3 for $5^{th}$ Generation New Radio (5G NR); and the second pass band is a frequency band of 2483.5 to 2500 MHz.

14. The radio-frequency circuit according to claim 13, further comprising:

a fifth switch connected between an output terminal of the low-noise amplifier circuit and each of first and second radio-frequency output terminals, the first radio-frequency output terminal being configured to output a received signal of the first pass band, the second radio-frequency output terminal being configured to output a received signal of the second band.

15. The radio-frequency circuit according to claim 14, wherein the fifth switch is configured to selectively connect the low-noise amplifier circuit to the first radio-frequency output terminal or to the second radio-frequency output terminal.

16. The radio-frequency circuit according to claim 13, further comprising:

a power amplifier; and a switch configured to selectively connect the first filter circuit to an output of the power amplifier, wherein the first pass band is further configured to pass a transmitted signal of the cellular communication system.

17. The radio-frequency circuit according to claim 13, wherein the amplifier circuit has first and second amplification modes, and wherein a system is configured to apply the first amplification mode when a sending signal of the first pass band is to be amplified and to apply the second amplification mode when a sending signal of the second pass band is to be amplified.

18. The radio-frequency circuit according to claim 11, wherein the amplifier circuit is a power amplifier circuit.

19. The radio-frequency circuit according to claim 11, wherein the amplifier circuit has first and second amplification modes, and wherein a system is configured to apply the first amplification mode when a sending signal of the first pass band is to be amplified and to apply the second amplification mode when a sending signal of the second pass band is to be amplified.

20. The radio-frequency circuit according to claim 1, wherein the cellular communication system comprises a non-terrestrial network (NTN) system.

\* \* \* \* \*